United States Patent [19]

Sakata

[11] Patent Number: 4,558,338

[45] Date of Patent: Dec. 10, 1985

[54] INSULATED GATE TYPE FIELD EFFECT TRANSISTOR HAVING A SILICON GATE ELECTRODE

[75] Inventor: Masanori Sakata, Tokyo, Japan

[73] Assignee: Nec Corporation, Tokyo, Japan

[21] Appl. No.: 523,656

[22] Filed: Aug. 15, 1983

[30] Foreign Application Priority Data

Aug. 19, 1982 [JP] Japan .................................. 57-144491

[51] Int. Cl.[4] ...................... H01L 29/04; H01L 29/78
[52] U.S. Cl. .................................... 357/23.9; 357/23.5;
                                                                    357/59
[58] Field of Search ........................ 357/59, 23.5, 23.9

[56] References Cited

U.S. PATENT DOCUMENTS

| 4,198,250 | 4/1980 | Jecmen | 357/59 |
| 4,371,890 | 2/1983 | Anagnostopoulos | 357/59 |
| 4,380,773 | 4/1983 | Goodman | 357/59 |

*Primary Examiner*—Martin H. Edlow
*Assistant Examiner*—Terri M. Henn
*Attorney, Agent, or Firm*—Laff, Whitesel, Conte & Saret

[57] ABSTRACT

The present invention relates to cross-sectional shape of a silicon gate electrode of an insulated gate field effect transistor. The gate electrode is composed of polycrystalline silicon, and its length, in cross section, gradually increases from the surface contacting to the gate insulating film toward the central portion thereof and then gradually decreases toward the upper surface thereof. The central portion of the polycrystalline silicon has the largest length in the source-drain direction and contains small amount of $SiO_2$ particles. Relying upon this gate shape, the portion having largest length, can be used as a mask to introduce impurities in a self-aligned manner to form source and drain regions. The thus formed source and drain regions create small capacity relative to the gate electrode. Therefore, a high speed transistor is realized.

4 Claims, 7 Drawing Figures

INSULATED GATE TYPE FIELD EFFECT TRANSISTOR HAVING A SILICON GATE ELECTRODE

BACKGROUND OF THE INVENTION

The present invention relates to an insulated gate type field effect transistor (hereinafter referred to as IGFET), and more particularly to an IGFET which has a silicon gate electrode.

IGFET's have heretofore been extensively used in which the source and drain regions are effectively formed by injecting ions using the silicon gate electrode as a mask.

In the IGFET's of the conventional art, however, the silicon gate electrode has such a cross-sectional shape that the length of its bottom surface attached to the gate insulating film on the semiconductor substrate is the same as, or is slightly greater than, the length of the opposite surface, i.e., of the upper surface thereof. That is, the silicon gate electrode according to the conventional art has an rectangular shape or a trapezoidal shape in cross section. Therefore, if the source and drain regions are formed by injecting impurities of the conductivity type opposite to that of the semiconductor substrate into the semiconductor substrate using the silicon gate electrode as a mask, followed by the heat treatment to forcibly diffuse the injected impurities, that is drive-in operation, the source and drain regions overlap the bottom surface of the silicon gate electrode which is contacting to the gate insulating film. Therefore, the coupling capacity increases between the silicon gate electrode and the source and drain regions to hinder high-speed operation.

In order to reduce the coupling capacity, therefore, it had been attempted to minimize the depth of the source-drain diffusion layer to reduce the expansion in the lateral directions. Despite such efforts, however, overlapping devolops by an amount corresponding to the depth of the source-drain diffusion layer. Further, if the depth is reduced, curvature at corner portions of the source and drain regions becomes steep, and the breakdown voltage decreases between the source or drain region and the substrate.

To improve the above-mentioned conventional art, there has been proposed a method in which a mask consisting of a photoresist or silicon dioxide ($SiO_2$) used for shaping the gate electrode is not removed but is used also as a mask for injecting ions to form the source and drain regions. This method makes it possible to inject impurity ions into places slightly separated away from the gate electrode. Therefore, when the source and drain regions are formed by the subsequent step of forced diffusion, overlapping between the gate electrode and the source-drain regions can be reduced, thereby to decrease the coupling capacity.

According to this method, however, the source and drain are usually formed by injecting ions at high concentrations under the applications of large energy. Therefore, when the photoresist is used as a mask for this method, after the ion injection process the photoresist mask is hardly removed. When $SiO_2$ is used, on the other hand, the $SiO_2$ film must be formed to a considerably large thickness. Thus, difficulty is involved for forming the mask, and manufacturing steps tend to become complicated.

SUMMARY OF THE INVENTION

The object of the present invention is to provide a semiconductor device which includes an IGFET having a small coupling capacity, and which can be manufactured without involving difficulties mentioned above.

According to the feature of the present invention, there is provided an IGFET comprising a semiconductor substrate having a semiconductor region of one conductivity type, source and/or drain region having the opposite conductivity type formed in the semiconductor region, a channel region abutted against the source and/or drain region and extending in its lengthwise direction, a gate insulating film formed on the channel region, and a gate electrode formed on the gate insulating film, the gate electrode including a lower layer of polycrystalline silicon attached to the gate insulating film at its bottom surface, an inner layer of polycrystalline silicon provided on the lower layer, and an upper layer of polycrystalline silicon provided on the inner layer and having an upper surface, the length of the inner layer in the lengthwise direction of the channel region being larger than that of the bottom surface of the lower layer and that of the upper surface of the upper layer. Favorably the length of the gate electrode in the lengthwise direction of the channel region gradually increases from the bottom surface attached to the gate insulating film toward inner layer and gradually decreases from the inner layer toward the upper surface.

Polycrystalline silicon of the inner layer contains a small amount of silicon dioxide ($SiO_2$) particles, e.g., contains about 0.1 to 2.0% by weight of $SiO_2$. Film thickness of the inner layer may be about 50 to 500 angstroms. In shaping the gate electrode by etching, the polycrystalline silicon of the inner layer which contains a small amount of $SiO_2$ is undercut in very small amounts compared with the upper and lower layers which do not contain $SiO_2$. This fact makes it possible to obtain the silicon gate electrode having the cross-sectional shape which a mentioned above.

By utilizing the above-mentioned gate electrode as a mask, impurities can be introduced into places separated away from the lower surface of the gate electrode, because the protruded inner layer of polycrystalline silicon containing a small amount of $SiO_2$ particles effectively prevents the impurity ions from being injected right under the protruded portion. Accordingly, the source-drain regions formed by the subsequent forced diffusion overlap little the lower surface of the gate electrode, and the coupling capacity can be reduced. Morever, photoresist or $SiO_2$ mask layer formed on the gate electrode is not necessary. Therefore, no problem develops such as the photoresist is peeled off with difficulty in a subsequent step.

An increase in the resistivity is as small as by 10% to 20% caused by the polycrystalline silicon layer which contains about 0.1 to 2.0% by weight of $SiO_2$. Moreover, the silicon gate generally has a film thickness of, for example, about 5000 angstroms, while the polycrystalline layer containing $SiO_2$ has a thickness of 50 to 500 angstroms. Therefore, increase in the resistance can virtually be neglected.

DESCRIPTION OF THE PRIOR ART

Figure 1:
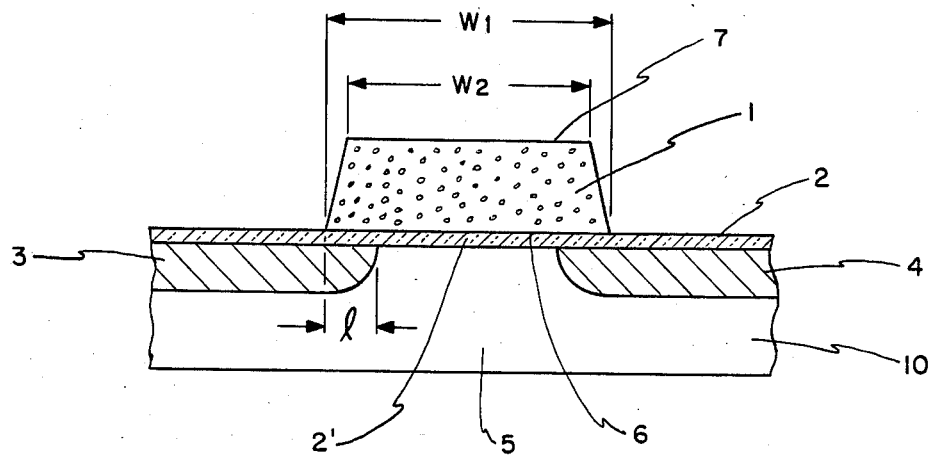
FIG. 1 is a cross-sectional view showing an IGFET according to a prior art.

According to an IGFET of the prior art shown in FIG. 1, a silicon oxide film 2 of a thickness of, for example, 1000 angstroms is formed on one major surface of a P-type region 10 of a silicon substrate, and a gate electrode 1 composed of polycrystalline silicon is formed on the silicon oxide film 2 on a portion that will become into a gate insulating film 2' on a channel region 5. The gate electrode 1 is formed by the reactive etching to a polycrystalline silicon layer of, for example, 5000 angstroms thick on the silicon oxide film 2, and using a patterned photoresist (not shown) formed thereon as a mask.

Through the etching, the length $W_1$ of the lower surface 6 of the gate electrode 1 contacting to the gate insulating film 2' in the lengthwise direction of the channel region 5 extending between a source region 3 and a drain region 4 which are to be formed becomes equal to, or larger than, the length $W_2$ of the upper surface 7 as shown in FIG. 1. Namely, the gate electrode 1 assumes a trapezoidal shape in the cross section.

Next, the photoresist used as a mask for etching is removed, and N-type impurities such as arsenic ions are implanted at an energy of 30 to 200 KeV and at a dosage of $10^{15}$ to $10^{16}$ atoms/cm$^2$ using the gate electrode 1 as a mask. Thereafter, the device is heated at 950° C. in a nitrogen atmosphere for 30 to 40 minutes to forcibly diffuse the introduced impurities, whereby a source region 3 and a drain region 4 are formed having a depth of 0.3 to 0.6 μm. In this case, due to diffusion in the lateral directions, the source and drain regions overlap the gate electrode each by a distance l of 0.25 to 0.5 μm, whereby the capacity increases between the gate electrode and the source and drain regions.

If the forced diffusion, that is drive-in diffusion, is effected under the conditions of, for example, a temperature of 900° C. and for a period of 30 minutes, depth of the source and drain regions becomes small and the overlapping area decreases correspondingly, which, however, is not still negligible. Further, such shallow source and drain regions have steep curvatures at corner portions, and impose problem with regard to breakdown voltage between the source and drain regions and the substrate.

Figure 2:
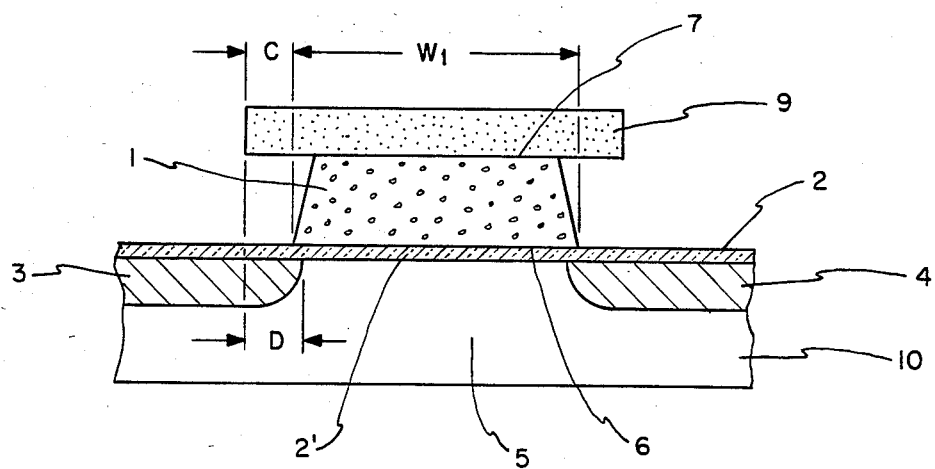
FIG. 2 is a cross-sectional view showing an EGFET according to another prior art.

An IGFET shown in FIG. 2 has also been proposed to reduce the capacity caused by the overlapping. In FIG. 2, the portions having the same functions as those of FIG. 1 are denoted by the same reference numerals. Namely, a polycrystalline silicon layer is uniformly deposited on the silicon oxide film 2, and the gate electrode is formed by the isotropic reactive plasma etching by using a mask 9 that is formed by patterning the photoresist or silicon oxide film formed on the polycrystalline silicon layer.

Then, by utilizing the mask 9 formed on the gate electrode 1 as a mask, N-type impurities are introduced by ion injection method into the semiconductor substrate. In this case, since the mask 9 is protruding beyond the gate electrode, the impurities are introduced into areas separated away from the ends of lower surface 6 of the gate electrode 1. In forming the source region 3 and the drain region 4 by the heat treatment, therefore, the forced diffusion is also effected in the lateral directions. However, since the impurities have been introduced in the areas separated away from the gate electrode, overlapping relative to the gate electrode develops to a reduced extent, for example, about 0.05 μm to a 0.1 μm by the diffusion in the lateral directions. That is, the undercutting amount C of the gate electrode 1 is selected to be slightly smaller than a depth D by which of source and drain regions will be diffused in the lateral directions.

Then, utilizing the mask 9, ions are injected to form the source and drain. In this case, the ions are injected except the area defined by the length of the mask 9. Namely, by selecting the length of the mask 9 to be greater than the length $W_1$ of the lower surface of the gate electrode, it is possible to form a transistor as shown in FIG. 2. In short, overlapping between the gate electrode 1 and the source and drain regions 3, 4 can be reduced to decrease the coupling capacity.

However, since the impurity ions are implanted under the application of energy of as high as 30 to 200 KeV and at a dosage of as high as $10^{15}$ to $10^{16}$ atoms/cm$^2$, the mask 9 of photoresist used in this step is almost baked and the removement after the process becomes difficult. When the mask 9 is composed of SiO$_2$, on the other hand, the mask 9 must be formed to a thickness of as great as 1.0 to 1.5 μm. That is, the mask can be formed with difficulty, and the manufacturing steps tend to become complicated.

DESCRIPTION OF THE EMBODIMENT

Figure 3A:
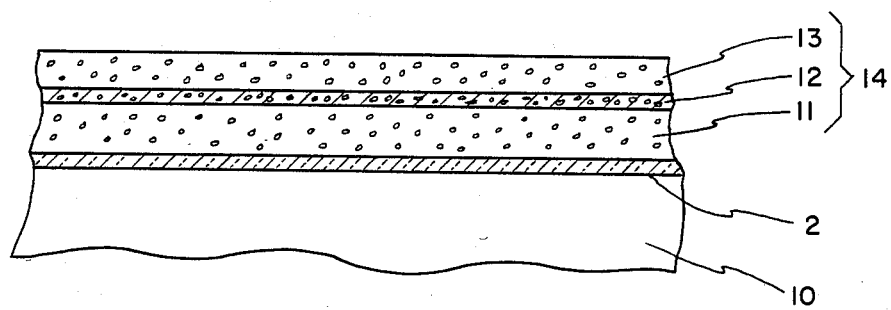
FIGS. 3A to 3D are cross-sectional views illustrating the steps according to an embodiment of the present invention.

Referring to FIG. 3A, a silicon oxide film 2 is formed to a thickness of 1000 angstroms by the thermal oxidation on one major surface of a semiconductor region 10 containing P-type impurities in the silicon substrate. A portion of the silicon oxide film 2 under a gate electrode turns into a gate insulating film. Then, silane (SiH$_4$) is reacted in a chamber in nitrogen at 600° C. to form a polycrystalline silicon film 14 which constitutes a gate electrode. To increase the electric conductivity of the polycrystalline silicon film 14, impurities may be introduced while the silicon film 14 is being formed or after the silicon film 14 is formed.

The polycrystalline silicon film 14 consists of a polycrystalline silicon layer 11 which is adhered to the silicon oxide film 2 and which does not substantially contain SiO$_2$ particles, a polycrystalline silicon layer 12 which is formed on the layer 11 and which contains SiO$_2$ particles 16 (indicated by dots) in small amounts, for example, in an amount of 0.1 to 2.0% by weight, and a polycrystalline silicon layer 13 which is formed on the layer 12 and which does not substantially contain SiO$_2$ particles. The abovementioned polycrystalline silicon film 14 is formed, for example, by effecting the reaction under the above-mentioned conditions for 20 minutes to form the film 11 which is about 2400 angstroms thick, introducing small amounts of oxygen (O$_2$) for 2 minutes to form the layer 12 which is about 200 angstroms thick, discontinuing the supply of oxygen and effecting the reaction for 20 minutes to form the layer 13 which is about 2400 angstroms thick.

Thickness of the layer 12 can be determined by a period of time in which oxygen is introduced, position of the layer 12 in the polycrystalline silicon film 14 can be determined by the time schedule when oxygen is introduced, and the amount of $SiO_2$ particles in the layer 12 can be determined by the concentration (amount) of oxygen introduced. Subsequently, phosphorus atoms are introduced in the polycrystalline silicon film 14 composed of layers 11, 12, 13 by thermal treatment at 1000° C. for 30 minutes. Then, phosphorus atoms are distributed uniformly in the film at about $10^{21}$ to $10^{22}/cm^3$ density. In this case, the specific resistivity of layers 11 and 13 become $10^{-3}$ to $10^{-4}$ $\Omega$-cm. However, the specific resistivity of layer 12 becomes 10 to 20% larger than that of layers 11 and 13 because of $SiO_2$ particles in the layer 12.

Figure 3B:
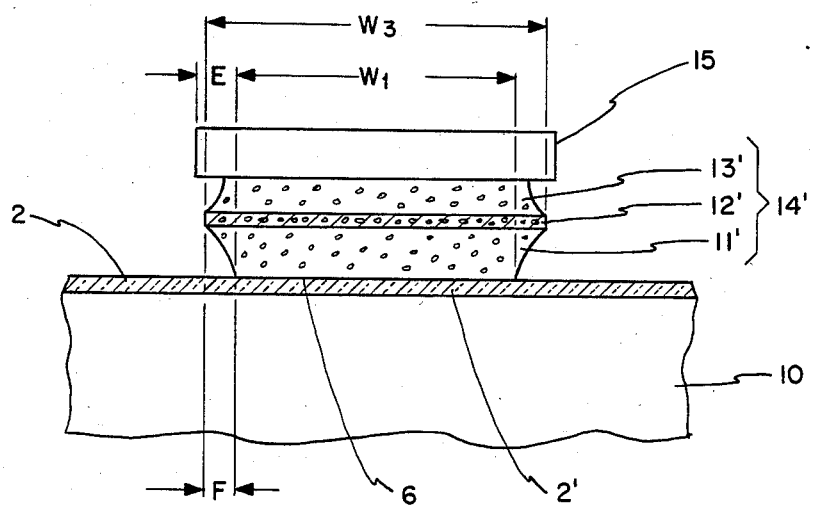

Referring to FIG. 3B, a photoresist layer 15 is formed, and the reactive isotropic plasma etching is effected to the polycrystalline silicon film 14 using the layer 15 as a mask, thereby to form a gate electrode 14' on a gate insulating film 2'. The plasma etching is effected, for example, under a reduced pressure and in atmosphere of carbon tetrachloride ($CCl_4$) and oxygen ($O_2$) in a chamber.

During the etching step, the polycrystalline silicon layers 11, 13 without containing $SiO_2$ particles are etched by about 1000 angstroms per minute, and are shaped as denoted by 11' and 13'. On the other hand, the polycrystalline silicon layer 12 containing $SiO_2$ particles is etched by an amount of as small as, for example, about 100 angstroms per minute though it may vary depending upon the $SiO_2$ content, and whereby a film is formed as denoted by 12'. The gate electrode 14' consists of layers 11', 12' and 13'.

Since the isotropic etching is being effected, the difference in the etching speed affects the undercutting amount under the mask 15, as a matter of course. That is, the polycrystalline silicon layers 11', 13' are undercut in large amounts, and the polycrystalline silicon layer 12' is undercut in negligibly small amount. Therefore, the gate electrode 14' assumes the cross-sectional shape as shown in FIG. 3B. For example, by further continuing the etching even after the etching front has reached the silicon oxide film 2 that serves as an etching stopper, the film 11' is undercut in increased amounts, so that the distance (undercutting amount) E between the end of the photoresist mask 15 and the end of the lower surface 6 becomes 0.25 to 0.45 $\mu$m. In this case,, the layer 12' containing $SiO_2$ is also undercut to some extent. Consequently, the distance F between the end of the layer 12' containing $SiO_2$ and the end of the lower surface 6 of the layer 11', i.e., one-half the difference between the length $W_3$ of the layer 12' and the length $W_1$ of the lower surface 6, can be selected to be 0.2 to 0.4 $\mu$m.

Figure 3C:
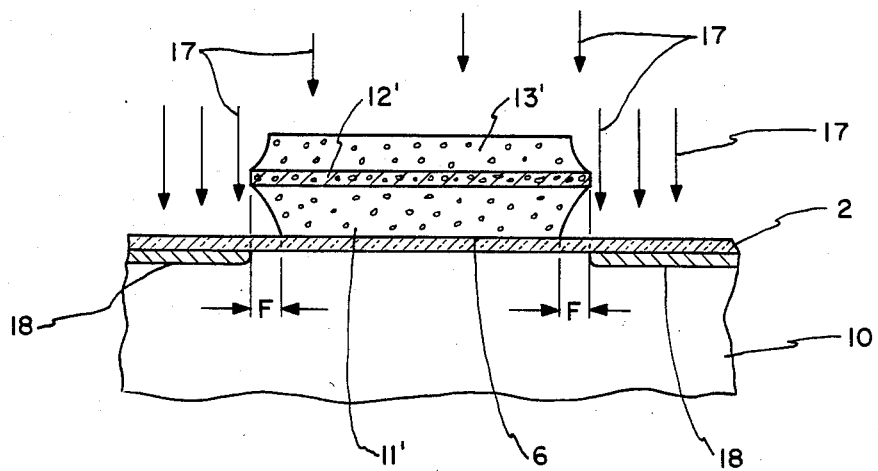

Referring to FIG. 3C, the mask 15 is removed, and arsenic ions are injected by ion implantation method. In this case, protruded portion of the gate electrode 14', i.e., the layer 12' which contains $SiO_2$, serves as a mask. Therefore, arsenic ions 17 are introduced in the areas of the silicon substrate separated by the distance F (0.2 to 0.4 $\mu$m) away from the end of lower surface 6 of the gate electrode 14'. The arsenic ions are injected through the silicon dioxide film 2 at an energy of 30 to 200 KeV and at a dosage of $10^{15}$ to $10^{16}$ atoms/$cm^2$. Thus, N-type ion-injected regions 18 are formed in the semiconductor region 10 containing P-type impurities in the silicon substrate.

Figure 3D:
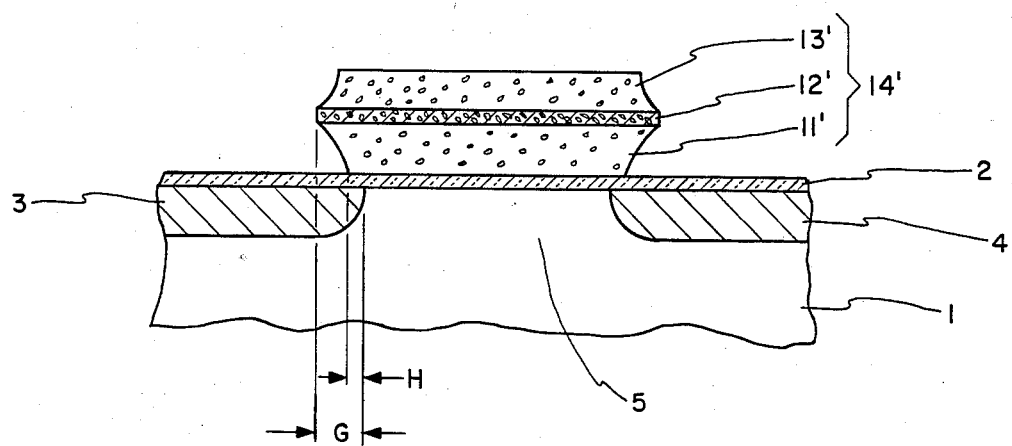

Referring to FIG. 3D, the thermal diffusion is effected in a nitrogen atmosphere at 950° C. for 30 to 40 minutes to form the source region 3 and the drain region 4 of a depth of 0.3 to 0.6 $\mu$m. In this case, the ions are also diffused in the lateral directions by a distance G of 0.25 to 0.5 $\mu$m. Therefore, the overlapping amount H relative to the gate electrode 14' can be reduced to as small as 0.05 to 0.1 $\mu$m.

Figure 4:
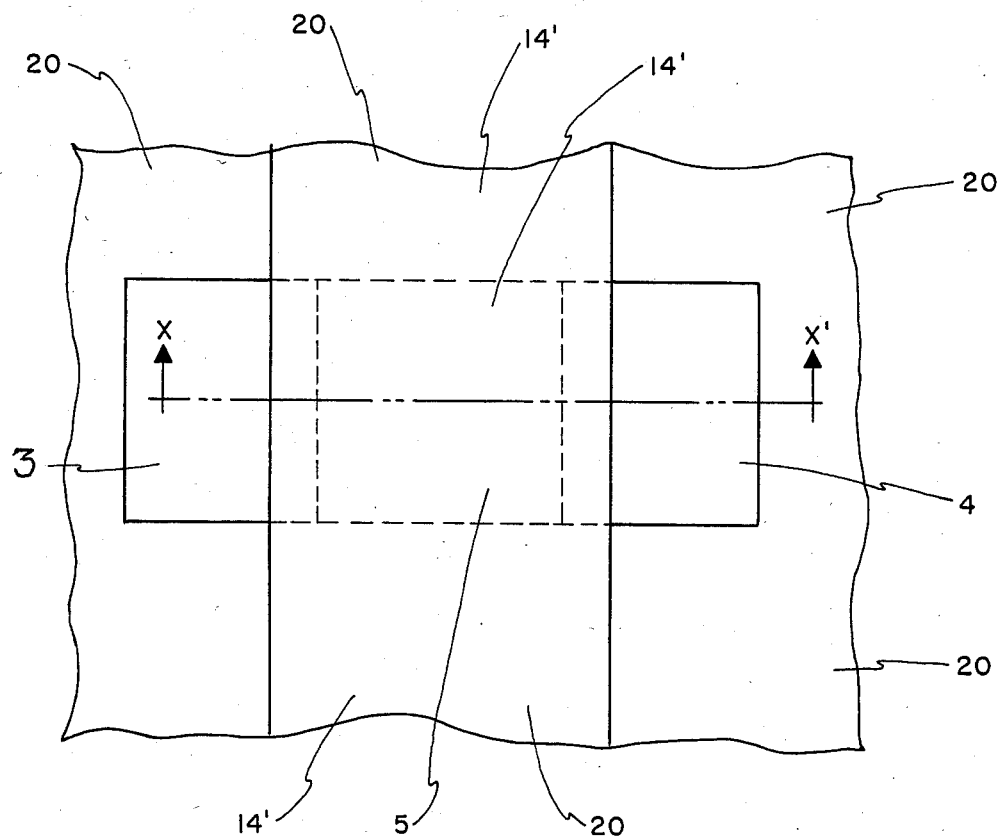
FIG. 4 is a plan view of the embodiment of the present invention, and wherein the FIG. 3D is a cross-sectional view of FIG. 4 taking along the line X-X' and viewed in the direction of arrow.

In the thus formed IGFET as shown in FIG. 4, thick field insulating film 20 are formed contiguous with each other so as to substantially surround the active regions, i.e., so as to surround the source region 3, channel region 5 and drain region 4. In the step of FIG. 3C, therefore, the field insulating film 20 are also used as the mask. The gate electrode 14' according to the embodiment extends from above the channel region 5 onto the field insulating films 20.

Thereafter, a silicon dioxide film is formed as a passivation film on the whole surface by the conventional vapor growth method. Then, contact holes of source and drain are formed, and wiring layers are connected to the source and drain regions through the contact holes. Further, wiring layer such as aluminum layer is connected to the gate electrode on the field insulating film 20, thereby to complete the IGFET. This step, however, is not directly related to the present invention, and is not diagrammed.

With the gate electrode of the present invention as mentioned above, the polycrystalline silicon layer containing $SiO_2$ is undercut very little during the step of etching and, hence, the width of the surface of the gate electrode contacting to the semiconductor substrate in the direction of source-drain becomes smaller than the width of the polycrystalline silicon layer which contains $SiO_2$. The difference between the length $W_1$ of the lower surface of gate electrode in the lengthwise direction of the channel region 5 between the source region 3 and the drain region 4 and the length $W_3$ of the $SiO_2$-containing polycrystalline silicon layer, is smaller than two times the depth of the source and drain diffusion layers, and the difference is the same on both the source side and the drain side. Further, difference in the undercutting amount, i.e., $(W_3-W_1)/2=F$, is selected to be slightly smaller than the amount G by which the source and drain diffusion layers will be diffused in the lateral directions in a subsequent step.

The upper polycrystalline silicon layer 13' without substantially containing $SiO_2$ is necessary for the gate electrode to have a predetermined electric conductivity and to desirably bring the wiring layer such as aluminum layer into contact with the upper surface of the gate elelectrode.

It has been clarified that by forming the above-mentioned layer 13' on the uppermost portion instead of forming the $SiO_2$-containing polycrystalline silicon layer 12' on the uppermost portion, the surface of the gate electrode becomes flat, and the production yield practically increases.

In the embodiment of FIG. 3, the $SiO_2$-containing layer 12' is located nearly at the center of the thickness of the gate electrode. The $SiO_2$-containing layer 12', however, needs not necessarily be located at the center if the relation between the size F and the diffusion distance G in the lateral direction is maintained.

The sectional shape of FIGS. 3B to 3D is obtained by forming the polycrystalline silicon films according to the step of FIG. 3A. Here, however, it is considered that distribution or concentration of $SiO_2$ particles has gradient to some extent. In the embodiment, furthermore, the photoresist was used as a mask for etching. However, any material other than the photoresist may be used provided it is capable of withstanding the etching that is effected for forming the gate electrode. Also, in the embodiment, the IGFET has both the source region 3 and the drain region 4. However, the present invention may be used in a dynamic memory cell, for example, in which only one source or drain region is provided.

With the inverted trapezoidal gate of the present invention, furthermore, stepped portion of the gate electrode tends to overhang compared with the trapezoidal gate (FIGS. 1 and 2). It was therefore considered so far that the metal wiring crossing over the inverted trapezoidal gate tends to be broken. However, when a phosphosilicate glass, for example, was grown on the inverted trapezoidal gate and was allowed to flow to make the stepped portions smooth, the metal wiring could be formed on the gate electrode quite in the same way as that of the stepped portions of the trapezoidal gate.

According to the present invention as mentioned above, an inverted trapezoidal gate can be easily formed to realize a semiconductor device equipped with an IGFET which has a small coupling capacity, i.e., which operates at high speeds.

What is claimed is:

1. An insulated gate type field effect transistor comprising a semiconductor substrate having a semiconductor region of one conductivity type, at least one of source and drain regions of the opposite conductivity formed in said semiconductor region, a channel region abutted against said one of said source and drain regions and extending in its lengthwise direction in said semiconductor region, a gate insulating film formed on said channel region, and a gate electrode formed on said gate insulating film, said gate electrode including a lower layer of polycrystalline silicon attached to said gate insulating film at its bottom surface and being substantially free from silicon dioxide particles, an inner layer of polycrystalline silicon provided on said lower layer and containing silicon dioxide particles therein, and an upper layer of polycrystalline silicon provided on said inner layer, being substantially free from silicon dioxide particles and having an upper surface,
a length of said inner layer in said lengthwise direction of said channel region being larger than that of said lower layer at said bottom surface of said lower layer.

2. An insulated gate type field effect transistor of claim 1, in which the length of said gate electrode increases gradually from said bottom surface toward said inner layer, and decreases gradually from said inner layer toward said upper surface.

3. An insulating gate type field transistor of claim 1, in which said inner layer contains 0.1 to 2.0% by weight of silicon dioxide.

4. An insulated gate type field effect transistor of claim 1, in which said inner layer has the thickness of 50 to 500 angstroms.

* * * * *